(12) United States Patent
Wong et al.

(10) Patent No.: US 7,214,594 B2
(45) Date of Patent: May 8, 2007

(54) METHOD OF MAKING SEMICONDUCTOR DEVICE USING A NOVEL INTERCONNECT CLADDING LAYER

(75) Inventors: Lawrence D. Wong, Beaverton, OR (US); Jihperng Leu, Portland, OR (US); Grant Kloster, Hillsboro, OR (US); Andrew Ott, Hillsboro, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 369 days.

(21) Appl. No.: 10/105,431

(22) Filed: Mar. 26, 2002

(65) Prior Publication Data

US 2003/0186535 A1    Oct. 2, 2003

(51) Int. Cl.
| | |
|---|---|
| H01L 21/00 | (2006.01) |
| H01L 21/82 | (2006.01) |
| H01L 21/76 | (2006.01) |
| H01L 21/265 | (2006.01) |
| H01L 21/44 | (2006.01) |
| H01L 29/80 | (2006.01) |

(52) U.S. Cl. .................... 438/319; 438/6; 438/98; 438/128; 438/411; 438/453; 438/523; 438/533; 438/598; 257/276; 257/522

(58) Field of Classification Search ........... 438/687, 438/691, 692, 693, 690, 706, 678, 98, 618, 438/624, 629; 257/758
See application file for complete search history.

(56) References Cited

U.S. PATENT DOCUMENTS

| | | | | |
|---|---|---|---|---|
| 4,810,332 A | * | 3/1989 | Pan ......................... 205/125 |
| 5,639,686 A | * | 6/1997 | Hirano et al. ............... 438/381 |
| 5,798,559 A | * | 8/1998 | Bothra et al. ............... 257/522 |
| 5,801,100 A | * | 9/1998 | Lee et al. .................... 438/678 |
| 6,143,641 A | * | 11/2000 | Kitch .......................... 438/618 |
| 6,184,121 B1 | * | 2/2001 | Buchwalter et al. ........ 438/622 |
| 6,245,658 B1 | * | 6/2001 | Buynoski .................... 438/619 |
| 6,271,135 B1 | * | 8/2001 | Palmans et al. ............ 438/687 |
| 6,307,265 B1 | * | 10/2001 | Anand et al. ................ 257/758 |
| 6,333,255 B1 | * | 12/2001 | Sekiguchi ................... 438/622 |
| 6,399,489 B1 | * | 6/2002 | M'Saad et al. ............. 438/680 |
| 6,413,852 B1 | * | 7/2002 | Grill et al. .................. 438/619 |
| 6,413,854 B1 | * | 7/2002 | Uzoh et al. ................. 438/637 |
| 6,734,061 B2 | * | 5/2004 | Hong et al. ................. 438/253 |
| 6,753,258 B1 | * | 6/2004 | Gaillard et al. ............. 438/691 |
| 6,774,491 B2 | * | 8/2004 | Ahn ........................... 257/773 |
| 6,838,355 B1 | * | 1/2005 | Stamper et al. ............. 438/409 |
| 6,908,829 B2 | * | 6/2005 | Hussein et al. ............. 438/421 |
| 2001/0014526 A1 | * | 8/2001 | Clevenger et al. .......... 438/619 |
| 2001/0039109 A1 | * | 11/2001 | Mathieu et al. ............. 438/597 |
| 2002/0140104 A1 | * | 10/2002 | Morrow et al. ............. 257/774 |
| 2003/0077892 A1 | * | 4/2003 | Fujikawa et al. ........... 438/619 |
| 2003/0219968 A1 | * | 11/2003 | Adem et al. ................ 438/622 |

\* cited by examiner

*Primary Examiner*—Carl Whitehead, Jr.
*Assistant Examiner*—James M. Mitchell
(74) *Attorney, Agent, or Firm*—Kenyon & Kenyon LLP

(57) ABSTRACT

A method and apparatus are provided an interconnect cladding layer. In one embodiment, a first sacrificial layer is deposited over a substrate and patterned. In the vias created during the patterning operation, a conductive material is placed to create conductive interconnects. After planarizing the conductive material, the sacrificial layer is removed leaving the interconnect exposed. A cladding layer is then deposited over the conductive material.

17 Claims, 4 Drawing Sheets

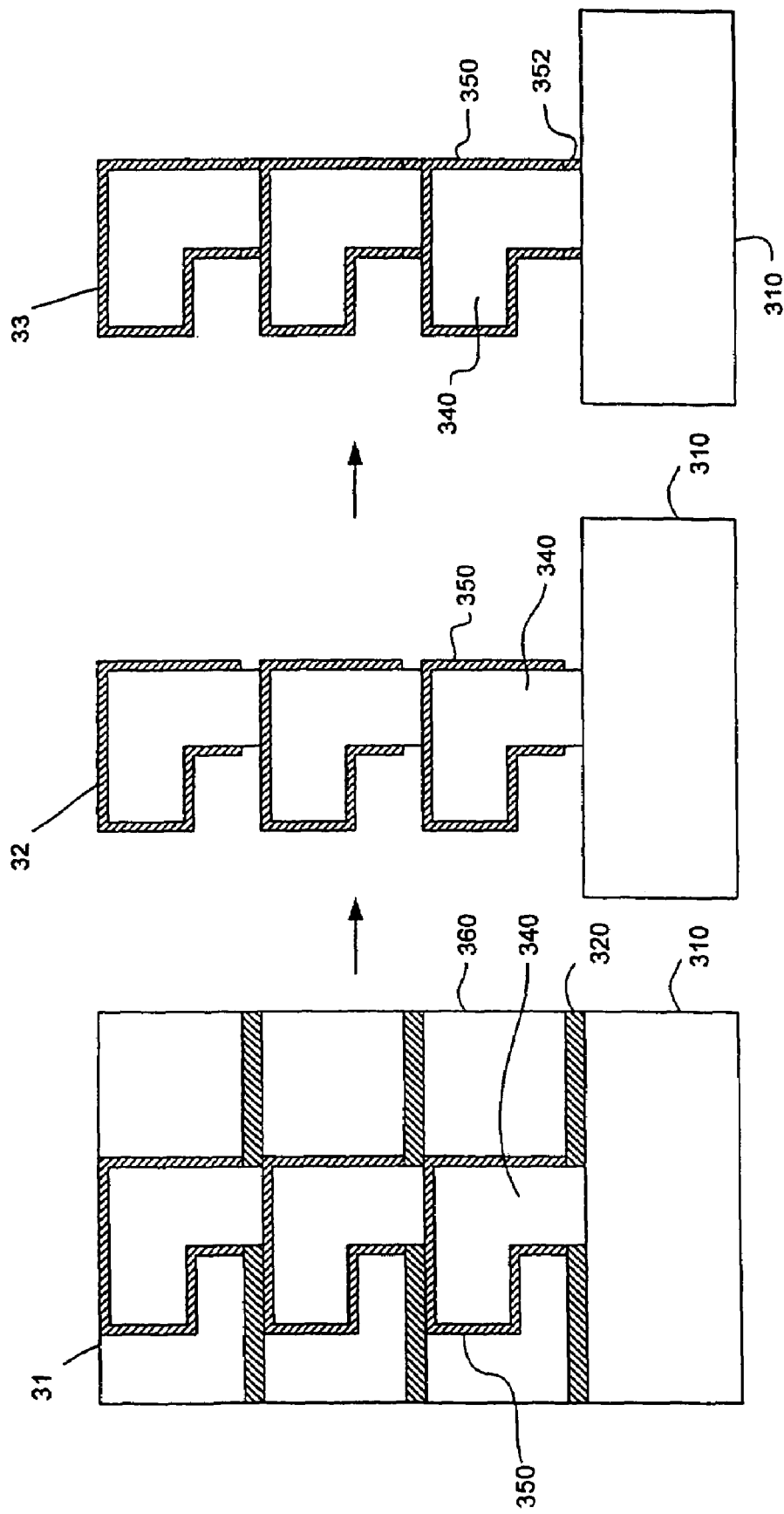

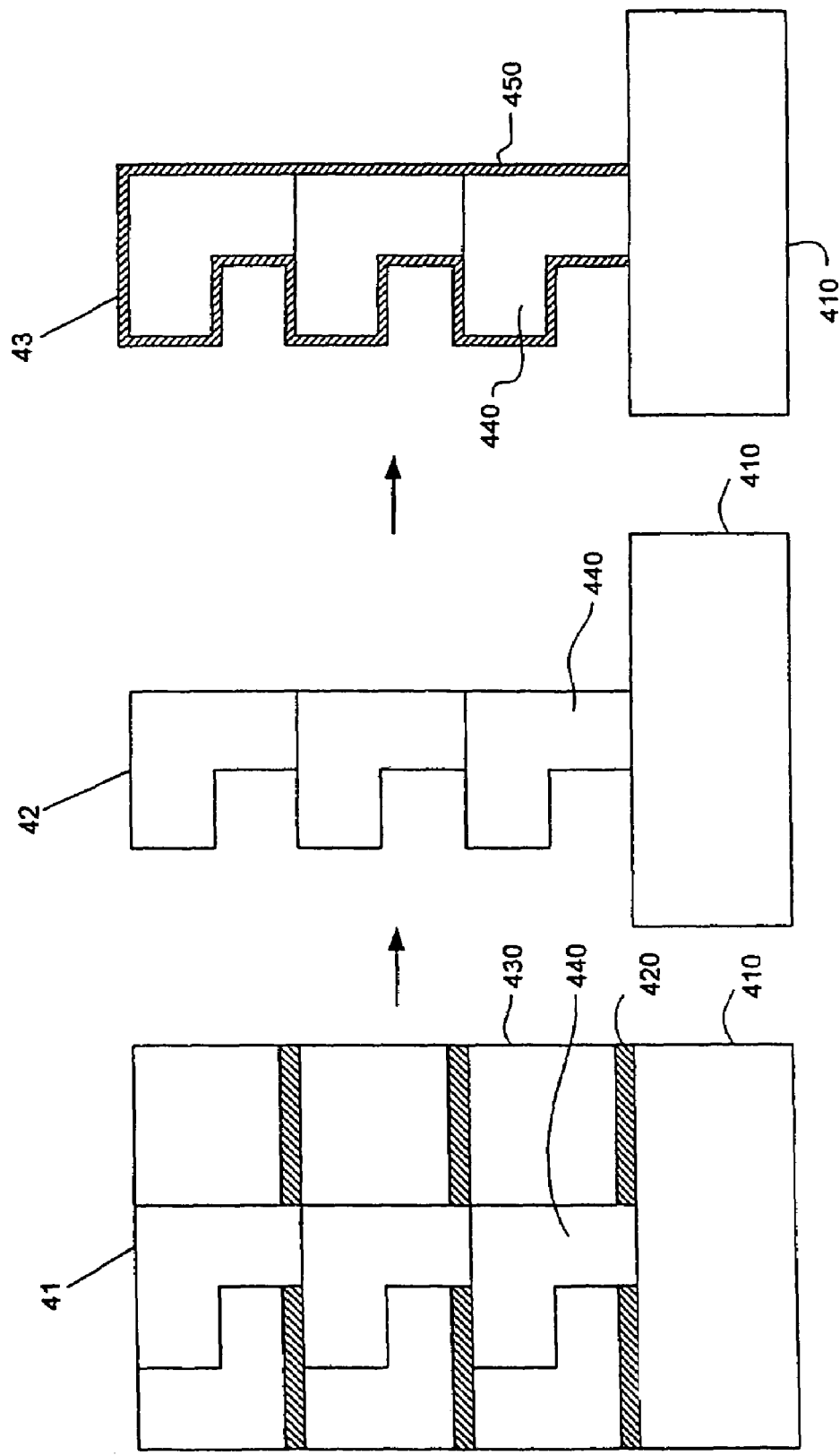

METHOD OF MAKING SEMICONDUCTOR DEVICE USING A NOVEL INTERCONNECT CLADDING LAYER

FIELD OF THE INVENTION

The invention relates to integrated circuit processing, and more particularly to the fabrication of interconnects on an integrated circuit.

BACKGROUND

Modern integrated circuits use conductive interconnects to connect the individual devices on a chip or to send and/or receive signals external to the chip. Popular interconnect materials include copper, aluminum, copper alloys, and aluminum alloys. In order to accommodate desired interconnect densities, multiple layers of interconnects, referred to as "metallization layers" may be used.

A typical method of forming an interconnect, particularly a copper interconnect, is a damascene process. A common conventional damascene process usually involves the following, as illustrated by FIGS. 1(a)–1(c):

(1) Deposit an etch stop 120 on a substrate 110.
(2) Deposit a dielectric layer 130. Because dielectric layer 130 will ultimately fill the space between interconnects within a particular layer, it may be referred to as an interlayer dielectric or ILD.
(3) Form a trench 132 having via openings 134 in the dielectric layer 130 and etch stop 120 to an underlying layer, such as substrate 110. For example, via openings 134 may expose the source, drain, or gate of a transistor. A hard mask 140 may be used to form the trench, but is not necessary. Structure 11 shows a partially fabricated interconnect layer after operation 3.
(4) Line the trench 132 and via opening 134 with a barrier layer of a refractory material, for example titanium nitride (TiN), tantalum (Ta) or tantalum nitride (TaN). The barrier layer serves to inhibit the diffusion of the interconnect material that will subsequently be introduced in the via and trench into the interlayer dielectric.
(5) Deposit a suitable seed material on the wall or walls of trench 132 and via opening 134. Suitable seed materials for the deposition of copper interconnect material include copper (Cu), nickel (Ni), and cobalt (Co).
(6) Deposit an interconnect material 150, such as copper, into the trench and via openings. Deposition methods include electroplating and physical deposition. Structure 12 shows a partially fabricated interconnect layer after operation 6.
(7) Planarize to remove any excess interconnect material and to form interconnect 160. Structure 13 shows an interconnect layer after operation 7.

Operations 1 through 7 may be repeated multiple times to fabricate multiple layers of metallization. After the final layer of metallization is fabricated, a dielectric material may be deposited to isolate the structure.

Although many different materials have been used as interconnect materials, copper has become a popular choice for various reasons. For example, copper has a low resistivity and a high melting point compared to aluminum or aluminum alloys. Low resistivity enables the use of thinner interconnects without sacrificing conductivity, and high melting point decreases susceptibility to migration during operation, which can lead to undesirable voids in the interconnect.

As chip processing technology advances and the packing density of devices increases, it is desirable to similarly increase the density of interconnects. This may be achieved by reducing the interconnect metal pitch, and by increasing the number of metallization levels. However, reduced interconnect pitch and/or increased metallization levels may lead to problems such as increased capacitance and degraded RC delay, cross-talk noise, and voids in the interconnect due to electro migration or stress migration.

What is needed are improved interconnect structures and techniques for improving the fabrication and properties of an interconnect structure.

BRIEF DESCRIPTION OF THE DRAWINGS

FIGS. 3(a)–3(c) show a process flow for a second embodiment.

FIGS. 4(a)–4(c) show a process flow for a third embodiment.

DETAILED DESCRIPTION

Novel and improved interconnect structures, and methods of fabricating such structures, are provided. Interconnects having cladding layers disposed thereon are provided. The cladding layer may improve reliability by providing an alternate path for electrical current in the event that the interconnect fails due to a void or other failure mechanism. The cladding layer may also improve performance by reducing cross-talk between closely spaced interconnects. It is expected that the novel structures may contribute to enabling interconnect pitches, i.e., the center-to-center distance between adjacent interconnects within an interconnect layer, of less than about 0.13 microns, and to improved interconnect reliability at such dimensions.

In a first embodiment, an interconnect layer is fabricated using damascene techniques and a sacrificial layer to pattern the interconnect. The sacrificial layer is then removed, and a cladding layer is deposited on the exposed interconnect. A dielectric material is then deposited to complete the interconnect layer. The process may be repeated multiple times to fabricate multiple interconnect layers.

Figure 1A:
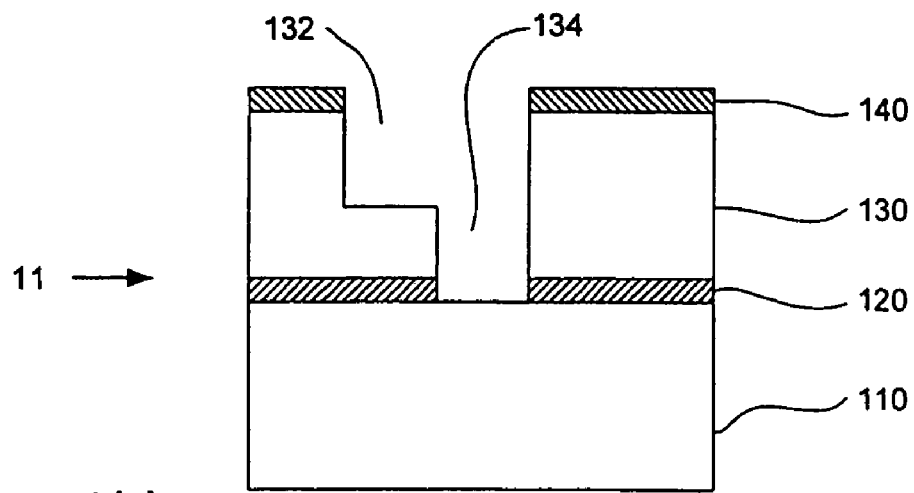
FIGS. 1(a)–1(c) show a process flow for a dual damascene process.
Figure 1B:
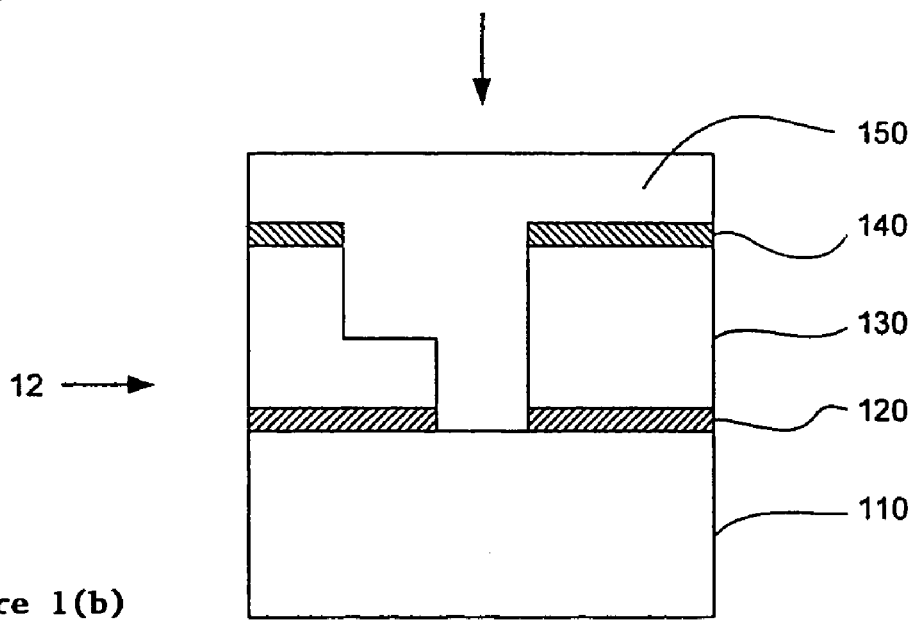
Figure 1C:
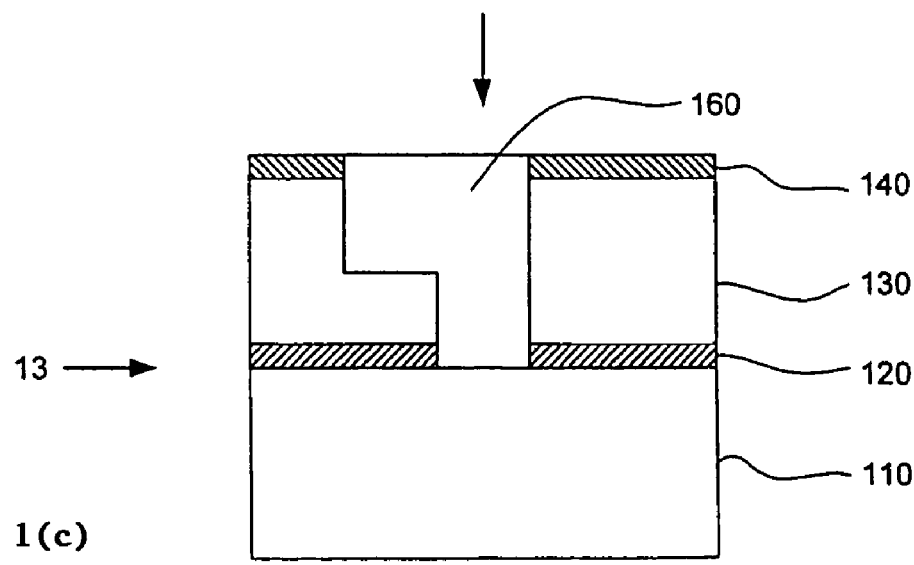
Figure 2A:
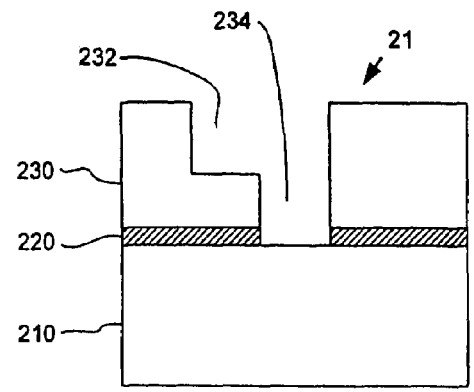
FIGS. 2(a)–2(f) show a process flow for as first embodiment.
Figure 2B:
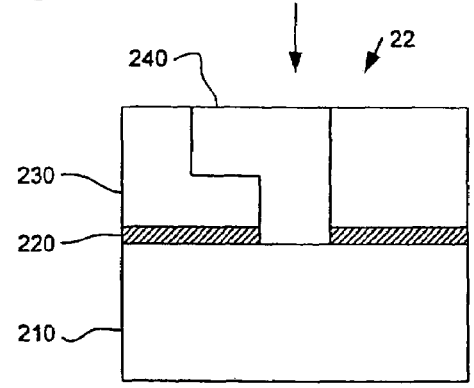
Figure 2C:
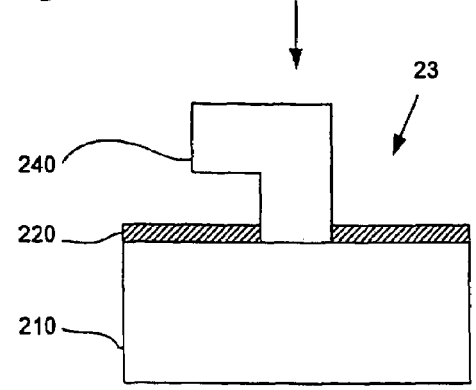
Figure 2D:
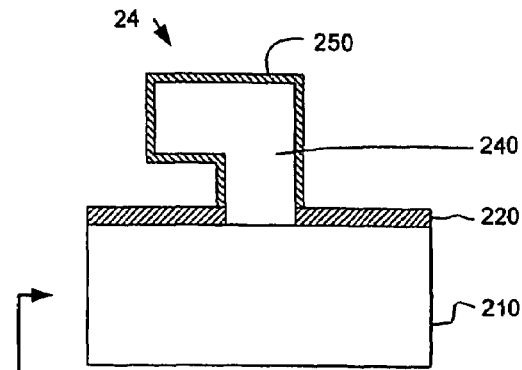
Figure 2E:
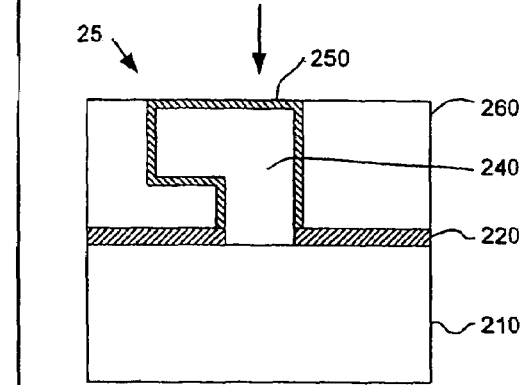
Figure 2F:
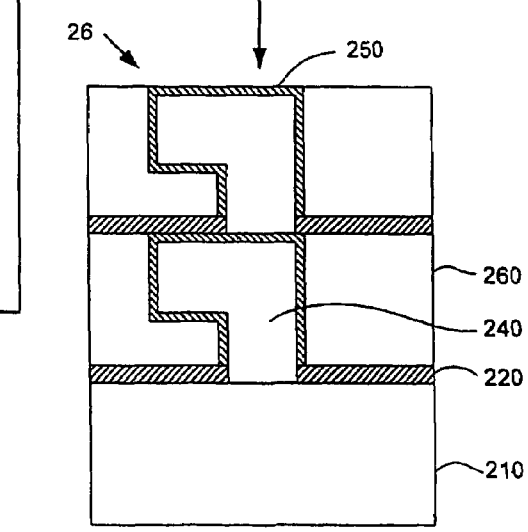

One way of practicing the first embodiment is described with respect to FIG. 2(a)–2(f):

(1) Deposit an etch stop 220 on a substrate 210.
(2) Deposit a sacrificial layer 230.
(3) Form a trench 232 having via openings 234 in sacrificial layer 230 and etch stop 220 to an underlying layer, such as substrate 210. A hard mask (not shown) may be used to form the trench, but is not necessary. Structure 21 shows a partially fabricated interconnect layer after operation 3.
(4) Line trench 232 and via opening 234 with a barrier layer of a refractory material.
(5) Deposit a suitable seed material on the wall or walls of trench 232 and via opening 234.
(6) Deposit an interconnect material into trench 232 and via openings 234. Structure 22 shows a partially fabricated interconnect layer after operation 6.
(7) Planarize to remove any excess interconnect material and to form interconnect 240. Structure 22 shows a partially fabricated interconnect layer after operation 7.

(8) Remove sacrificial layer 230. Structure 23 shows a partially fabricated interconnect layer after operation 8.
(9) Deposit cladding layer 250 on interconnect 240. Structure 24 shows a partially fabricated interconnect layer after operation 9.
(10) Deposit and planarize dielectric layer 260. Structure 25 shows an interconnect layer after operation 10.

Operations 1 through 10 may be repeated to form additional interconnect layers. Also, operations 4 through 6 may be replaced with a electroless deposition of a suitable interconnect material Doing do, removes the need for deposition of a barrier layer and a seed material and may proide better interconnect performance.

Structure 26 shows two interconnect layers, after operations 1 through 10 have been performed twice. Each interconnect layer has an interconnect 240 clad with a cladding layer 250. Interconnect 240 and cladding layer 250 are encased in dielectric layer 260. Interconnect 240 may make electrical contact with interconnects or devices present on previously deposited layers through via hole 234. Although only a single trench having a single via opening is illustrated for each interconnect layer, it is understood that more complex structures may be fabricated, where each interconnect layer may have many trenches and via openings.

Etch stop 220 may be any suitable etch stop known to the art. Preferably, etch stop 220 may also function as a diffusion barrier, reducing any diffusion of interconnect materials from an interconnect layer into adjacent layers. Depending upon the particular processes and materials utilized, etch stop 220 may be omitted. The use of a diffusion barrier is particularly preferred when devices on an underlying substrate are sensitive to contamination by the interconnect material. For interconnects 240 made of Cu, preferred etch stop materials that also function as diffusion barriers include SiN and SiC.

Sacrificial layer 230 may be made of any suitable material. Preferably, sacrificial layer 230 may be an interlayer dielectric material, because processes used to pattern trenches and via openings into such materials are well known, as are processes for depositing conductive materials into such trenches and via openings. However, because sacrificial layer 230 is ultimately removed, its dielectric constant is of no consequence, so other materials may also be used for sacrificial layer 230.

The barrier layer referred to in operation (4) may be any suitable material that inhibits diffusion of the subsequently deposited interconnect material. Preferred barrier materials include titanium nitride (TiN), tantalum (Ta) or tantalum nitride (TaN). This barrier layer is optional, and may be omitted. However, it may be preferable to include the barrier layer, because the processes for depositing a barrier layer, a seed layer, and an interconnect material, in that order, are well known to the art.

The seed layer may be any suitable material that will enhance the subsequent deposition of interconnect material. Suitable seed materials for the deposition of copper as an interconnect material include copper (Cu), nickel (Ni), and cobalt (Co). The seed layer may be omitted if the interconnect material can be adequately deposited without a seed layer.

Interconnect 240 may be made of any suitable conductive material. Copper is preferred for its superior conductive properties. Preferred methods for depositing the copper include electroplating and physical deposition, Cladding layer 250 may be made of any suitable material. Preferably, cladding layer 250 may function as a shunt. In particular, cladding layer 250 may be a conductive material, such that cladding layer 250 acts as a shunt by providing a conductive path alternate to interconnect 240. Such an alternate conductive path allows an interconnect to remain functional even if a void forms in the interconnect. Preferably, the material and deposition method of cladding layer 250 are chosen such that cladding layer 250 is selectively deposited on interconnect 240. Preferred cladding materials for a copper interconnect include Co, Ni, and Sn. Preferred deposition methods for these materials include selective chemical vapor deposition (CVD)/plasma enhanced CVD (PECVD), atomic layer (ALCVD), electroplating and electroless plating. Preferably, cladding layer 250 completely covers interconnect 240, such that every surface of interconnect 240 is in contact with either (a) cladding layer 250; (b) etch stop 220; or (c) a device or interconnect of the underlying layer or upper layer (if provided).

Dielectric layer 260 may be made of any suitable dielectric material. Materials having a lower dielectric constant (k) are preferred, because low dielectric constant materials decrease interconnect capacitance. Voids may be intentionally introduced into dielectric layer 260 to further reduce interconnect capacitance. Preferred dielectric materials include $SiO_2$ (k=4+), SiOF (k=3.6–3.8), carbon-doped oxides (k=2.8–3.1) and polymer-containing dielectrics (k=2.8–3.1). Preferred methods for depositing dielectric layer 260 include CVD and spin-on.

In a second embodiment, an interconnect layer is fabricated using damascene techniques and a first sacrificial layer to pattern the interconnect. The first sacrificial layer is then removed, and a cladding layer is deposited on the exposed interconnect. A second sacrificial layer is then deposited to form a platform for the fabrication of subsequent interconnect layers. The process may be repeated multiple times to fabricate multiple interconnect layers. Then, the second sacrificial layer of multiple interconnect layers is removed. Additional cladding may be deposited to fill in any gaps in the cladding already deposited.

One way of practicing the second embodiment is described with respect to FIG. 3(a)–3(c):
(1) Deposit an etch stop 320 on a substrate 310.
(2) Deposit a first sacrificial layer (not shown).
(3) Form a trench having via openings in the first sacrificial layer and etch stop 320 to an underlying layer, such as substrate 310. A hard mask (not shown) may be used to form the trench, but is not necessary.
(4) Line the trench and via opening with a barrier layer of a refractory material.
(5) Deposit a suitable seed material on the wall or walls of the trench and via opening.
(6) Deposit an interconnect material into the trench and via openings.
(7) Planarize to remove any excess interconnect material and to form interconnect 340.
(8) Remove the first sacrificial layer (not shown).
(9) Deposit a cladding layer 350 on interconnect 340.
(10) Deposit a second sacrificial layer 360.
(11) Repeat operations 1 through 10, possibly multiple times, to achieve a desired number of interconnect layers. Structure 31 shows a partially fabricated interconnect structure after three interconnect layers have been partially fabricated. Operation 10 may be omitted for the last interconnect layer.
(12) Remove second sacrificial layer 360 and etch stop 320. Structure 32 shows a partially fabricated interconnect structure after operation 12.
(13) Deposit portions 352 of cladding layer 350 to fill in any gaps, for example gaps that may have been left by the removal of etch stop 320. The filling in of any gaps can be done, for example, by a repair process such as a selective electroplating process.

Structure 33 shows an interconnect structure having three interconnect layers after operation 13 has been performed. Each interconnect layer has an interconnect 340 clad with a cladding layer 350. Interconnect 340 and cladding layer 350 are not encased in a dielectric material; rather, interconnects are separated from each other by an air gap, which has dielectric properties superior to most materials. Interconnect 350 may make electrical contact with interconnects or devices present on previously deposited layers. Although an interconnect patterned with only a single trench having a single via opening is illustrated for each interconnect layer, it is understood that more complex structures may be fabricated, where each interconnect layer may have interconnects patterned with many trenches and via openings.

Operations 1 through 9 of the second embodiment are very similar to the corresponding operations of the first embodiment. Accordingly, several of the features that are not shown in FIGS. 3(a)–3(c) correspond to similar features that are shown in FIGS. 2(a)–2(f).

Depending upon the particular processes and materials utilized, etch stop 320 may be omitted. If etch stop 320 is omitted, operation 13 may also be omitted.

Preferred materials and methods for the second embodiment are similar to those of the first embodiment, except as noted below.

The barrier layer deposited in operation 4 may be omitted in any embodiment. However, such omission is particularly preferred in the second and third embodiment, because the finished device has no interlayer dielectric adjacent to the interconnect into which interconnect material might diffuse.

Second sacrificial layer 360 may be made of any suitable material. Second sacrificial layer 360 is ultimately removed, so its dielectric properties are of no consequence to the completed structure. Accordingly, preferred materials for second sacrificial layer 360 are similar to those of sacrificial layer 230 of the first embodiment.

Preferably, cladding layer 350 completely covers interconnect 340, such that every surface of interconnect, such that every surface of interconnect 340 is in contact with either (a) cladding layer 350 (including portions 352 of cladding layer 350); or (b) a device or interconnect of the underlying layer or upper layer (if provided).

In the second embodiment, cladding is present on the interconnects of a particular interconnect layer while subsequent interconnect layers are fabricated. Such cladding protects the interconnect during subsequent fabrication operations.

In a third embodiment, an interconnect layer is fabricated using damascene techniques and a sacrificial layer to pattern the interconnect. Multiple interconnect layers may be fabricated using damascene techniques. Then, the sacrificial layer of multiple interconnect layers is removed. The exposed interconnect surfaces are then covered with a cladding layer.

One way of practicing the third embodiment is described with respect to FIGS. 4(a)–4(c).

The process of the third embodiment are the same as those of the second embodiment, except operations 8, 9 and 10 are omitted. Substrate 410, etch stop 420, sacrificial layer 430, and interconnect 440 of FIGS. 4(a)–4(c) correspond to substrate 310, etch stop 320, sacrificial layer 330, and interconnect 340 of FIGS. 3(a)–3(c), respectively, and are preferably made of similar materials. The entire cladding layer 450 is deposited in operation 13, preferably using the materials and methods described with respect to the first embodiment.

Structure 41 shows a partially fabricated interconnect structure after operation 11, where three interconnect layer have been fabricated.

Structure 42 shows a partially fabricated interconnect structure after operation 12, i.e., after sacrificial layer 430 has been removed.

Structure 43 shows an interconnect structure having three interconnect layers after operation 13 has been performed, i.e., after cladding layer 450 has been deposited. Each interconnect layer has an interconnect 440 clad with a cladding layer 450. Interconnect 440 and cladding layer 450 are not encased in a dielectric material; rather, interconnects are separated from each other by an air gap, which has dielectric properties superior to most materials. Interconnect 440 may make electrical contact with interconnects or devices present on previously deposited layers. Although an interconnect patterned with only a single trench having a single via opening is illustrated for each interconnect layer, it is understood that more complex structures may be fabricated, where each interconnect layer may have interconnects patterned with many trenches and via openings.

Preferably, cladding layer 450 completely covers interconnect 440, such that every surface of interconnect 440 is in contact with either (a) cladding layer 450; or (b) a device or interconnect of the underlying layer.

In the third embodiment, cladding is not present on the interconnects of a particular interconnect layer when subsequent interconnect layers are fabricated. As a result, the amount of processing is reduced. However, there is a trade-off in that the interconnects may be more susceptible to damage during the subsequent processing.

Although various embodiments are illustrated and described as applied to a dual damascene process, i.e., a process in which trenches having via holes are formed and then filled with a conductive material, is understood that the embodiments may be practiced with other processes, including regular damascene.

Although the various embodiments are illustrated as having cladding layers on all interconnects, it is understood that the various embodiments may be practiced on only one or a few interconnect layers, even if the device has additional interconnect layers. Cladding may be applied to only selected interconnect layers or interconnects. Limiting the cladding in this way may be desirable to reduce costs, while still achieving the benefits of cladding for those interconnects where it may be most beneficial. In particular, the first few levels of interconnects generally have a smaller pitch than subsequently-deposited interconnects. As a result, the need for cladding on subsequently-deposited interconnects, with their larger pitch, may not be as great and it may be possible to clad only the first one or few interconnect layers, and omit cladding from subsequent interconnect layers to reduce processing cost.

Various embodiments have been specifically described. However, it is evident that various changes and modifications may be made thereto without departing from the broader spirit and scope of the invention as set forth in the claims. Accordingly, the specification and drawings are intended to illustrate rather than restrict the scope of the invention.

What is claimed is:

1. A method of fabricating a device, comprising:
   (a) depositing a first sacrificial layer over a substrate;

(b) patterning a first via opening through the first sacrificial layer;
(c) depositing a first conductive material into the via opening so as to contact the walls of the via opening and entirely fill the via opening;
(d) planarizing the first conductive material;
(e) removing the first sacrificial layer; and
(f) depositing a first conductive cladding layer over the first conductive material, so that the first conductive cladding layer is on an entire top surface and sides of the first conductive material.

2. The method of claim 1, further comprising depositing a first etch stop over the substrate before depositing the first sacrificial layer, wherein the first via opening is patterned through the first sacrificial layer and the first etch stop.

3. The method of claim 2, wherein the first etch stop comprises a diffusion barrier material.

4. The method of claim 2, further comprising:
(g) depositing a first interlayer dielectric layer over the first conductive cladding layer;
(h) depositing a second etch stop over the first interlayer dielectric layer;
(i) depositing a second sacrificial layer over the second etch stop;
(j) patterning a second via opening through the second sacrificial layer and second etch stop such that a portion of the first conductive cladding layer is exposed;
(k) depositing a second conductive material into the second via opening;
(l) planarizing the second conductive material;
(m) removing the second sacrificial layer;
(n) depositing a second conductive cladding layer on the second conductive material; and
(o) depositing a second interlayer dielectric over the second conductive cladding layer.

5. The method of claim 4, wherein voids are formed in the first interlayer dielectric during deposition.

6. The method of claim 4, wherein the first and second conductive materials comprise copper.

7. The method of claim 1, wherein the first conductive material includes copper.

8. The method of claim 1, wherein the first conductive cladding layer is deposited by chemical vapor deposition, plasma enhanced chemical vapor deposition, or atomic layer chemical vapor deposition.

9. The method of claim 1, wherein the first conductive cladding layer is deposited by electroplating.

10. The method of claim 1, wherein the first conductive cladding layer is deposited by selective electroless plating.

11. The method of claim 1, wherein the first conductive cladding layer includes Co, Ni, or Sn.

12. The method of claim 1, further comprising:
patterning a first trench in the first sacrificial layer before depositing the first conductive material, and wherein the first conductive material is deposited into the first trench and the first via opening.

13. The method of claim 1,
wherein an interconnect pitch is less than about 0.13 microns.

14. The method of claim 1, wherein the first sacrificial layer comprises an interlayer dielectric material.

15. The method of claim 1, wherein the planarizing is accomplished with a chemical mechanical polish.

16. The method of claim 1, wherein the first conductive cladding layer completely covers the first conductive material.

17. The method of claim 1, wherein the first conductive cladding layer is not on a bottom of the first conductive material.

* * * * *